United States Patent [19]

Scholz et al.

[11] Patent Number: 4,997,390

[45] Date of Patent: Mar. 5, 1991

[54] SHUNT CONNECTOR

[75] Inventors: James P. Scholz, New Cumberland; Gregory G. Griffith, Carlisle; Brent D. Yohn, Newport, all of Pa.

[73] Assignee: AMP Incorporated, Harrisburg, Pa.

[21] Appl. No.: 373,377

[22] Filed: Jun. 29, 1989

[51] Int. Cl.$^5$ .............................................. H01R 4/24
[52] U.S. Cl. ..................................... 439/509; 439/79; 439/511
[58] Field of Search ................. 439/509–511, 439/507, 79–81, 632, 893

[56] References Cited

U.S. PATENT DOCUMENTS

| | | | |
|---|---|---|---|
| 3,413,594 | 11/1968 | Fernald et al. | |
| 3,634,816 | 1/1972 | Zell | 339/186 M |
| 3,711,817 | 1/1973 | Carter et al. | 339/121 |
| 3,725,843 | 4/1973 | Johnson | 439/507 |
| 3,909,097 | 9/1975 | Roth et al. | 439/511 |
| 4,030,793 | 6/1977 | Hanlon et al. | 439/511 |
| 4,059,320 | 11/1977 | Piaget | 439/511 |
| 4,090,667 | 5/1978 | Crimmins | 439/511 |
| 4,482,198 | 11/1984 | Crowley | 339/19 |
| 4,591,221 | 5/1986 | DeBrouckere et al. | 439/509 |
| 4,680,568 | 7/1987 | Corrao et al. | 337/186 |
| 4,689,597 | 8/1987 | Galloway et al. | 337/186 |
| 4,689,718 | 8/1987 | Maue et al. | 439/511 |
| 4,755,151 | 7/1988 | Beaulieu et al. | 439/511 |
| 4,786,258 | 11/1988 | Shaffer et al. | 439/188 |
| 4,808,115 | 2/1989 | Norton et al. | 439/79 |
| 4,820,194 | 4/1989 | Stine | 439/510 |
| 4,867,690 | 9/1989 | Thumma | 439/79 |
| 4,869,677 | 9/1989 | Johnson et al. | 439/80 |

OTHER PUBLICATIONS

AMP catalog, "AMP-HDI 2-Piece Pc Board Connectors Catalog 81-655" pp. 13–15, 38, 39 & 43.

Primary Examiner—Paula A. Bradley
Attorney, Agent, or Firm—Katherine A. Nelson

[57] ABSTRACT

A shunt connector 20 is disclosed for use in a system 30 including a mother board 32 having a plurality of electrical connectors 46 connected in series thereon for electrical interconnection with an array of daughter boards 62 wherein at least one of the mother board connectors 46 is not interconnected to a respective daughter board. Shunt connector 20 comprises a dielectric housing member 22 adapted to be mated with a mother board connector 46 and a plurality of shunt terminal members 28 secured in housing member 22. The shunt terminal members 28 are selectively shaped and selectively positioned in housing member 22 to correspond to open circuits desired to be closed in the at least one unmated mother board connector 46. Upon inserting the shunt connector 20 to the unmated mother board connector 46, open circuits are closed by said shunt terminal members 28, thus allowing signals to be transmitted between adjacent daughter boards 62 and through the system 30.

20 Claims, 6 Drawing Sheets

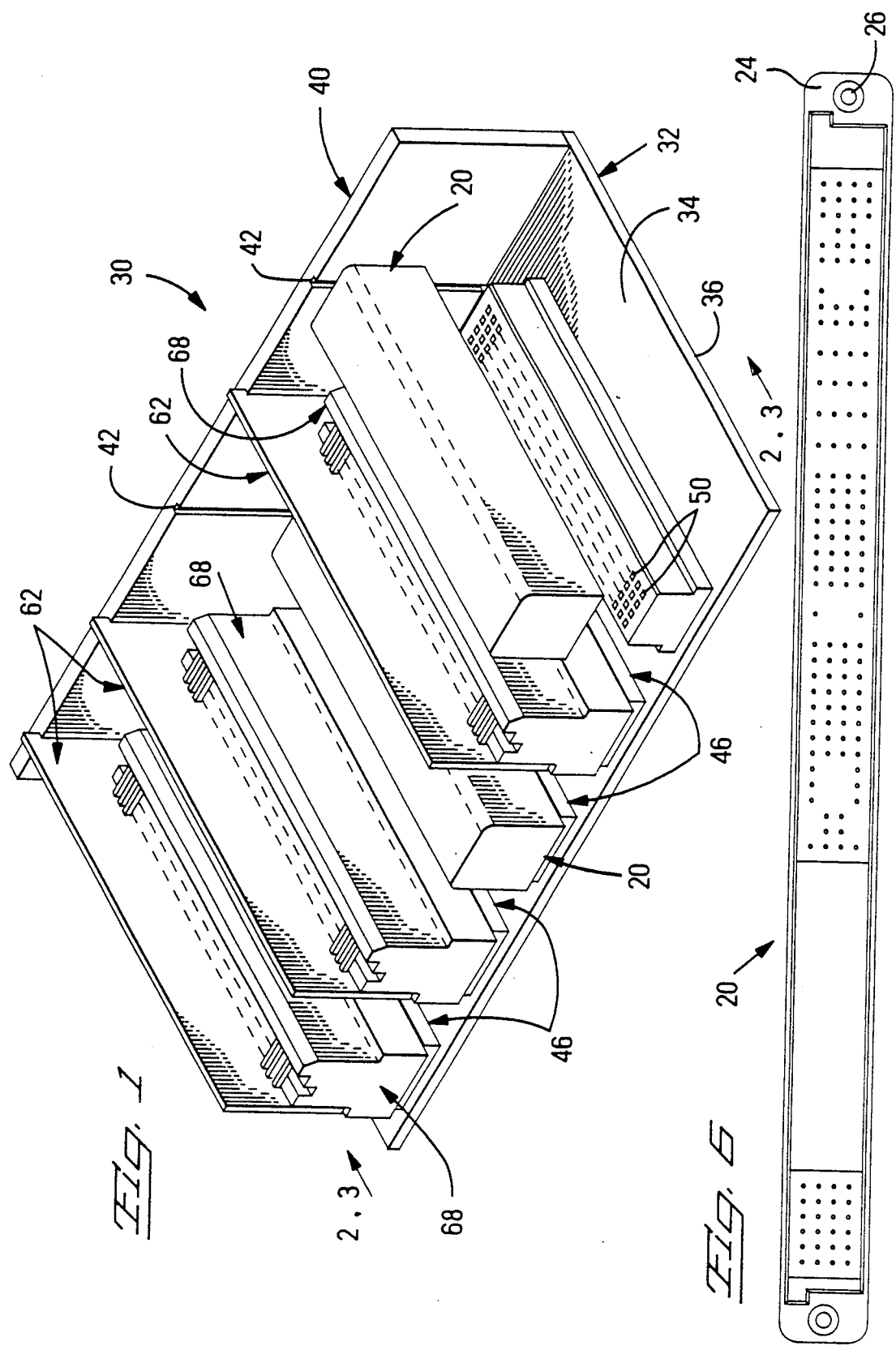

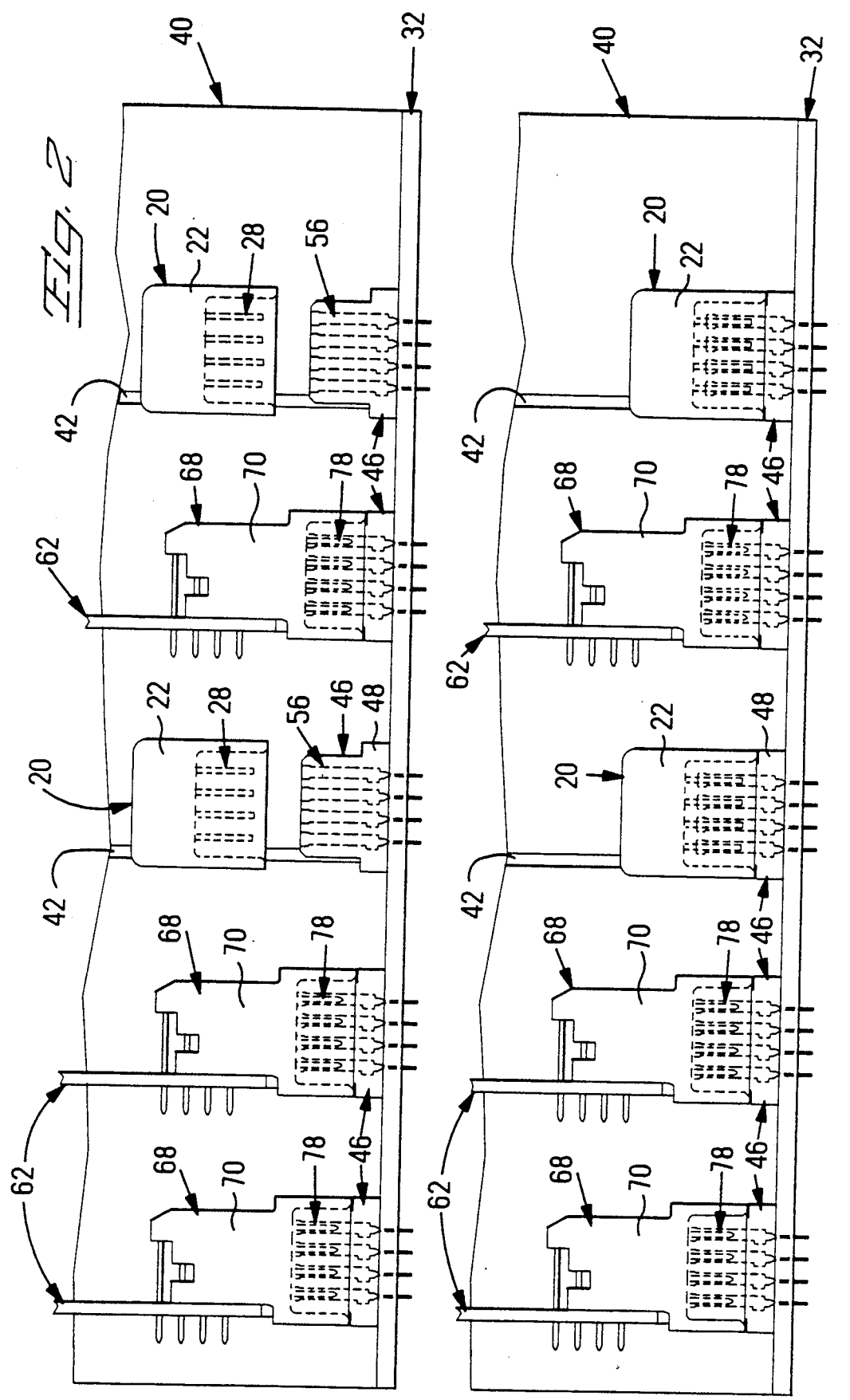

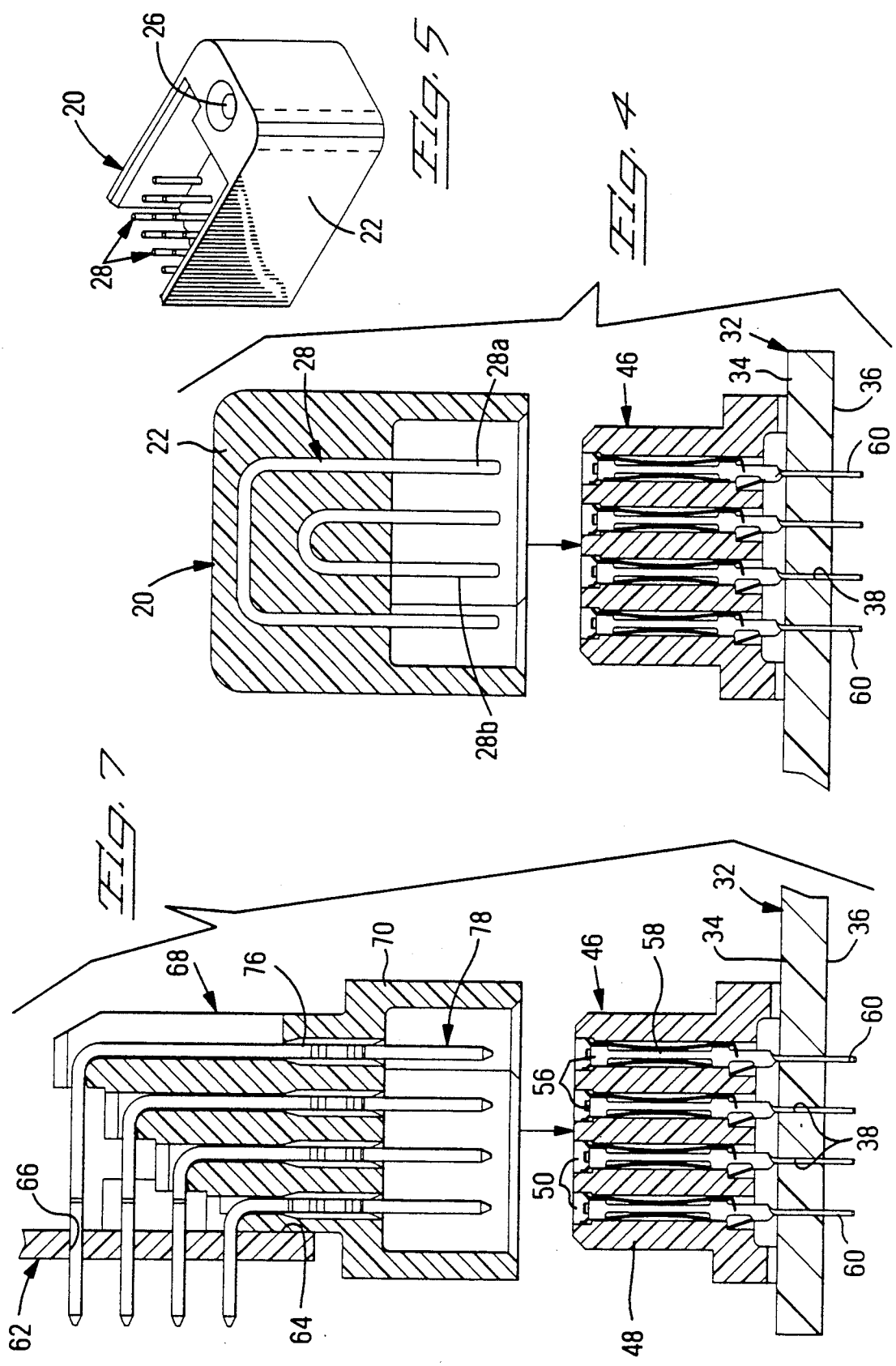

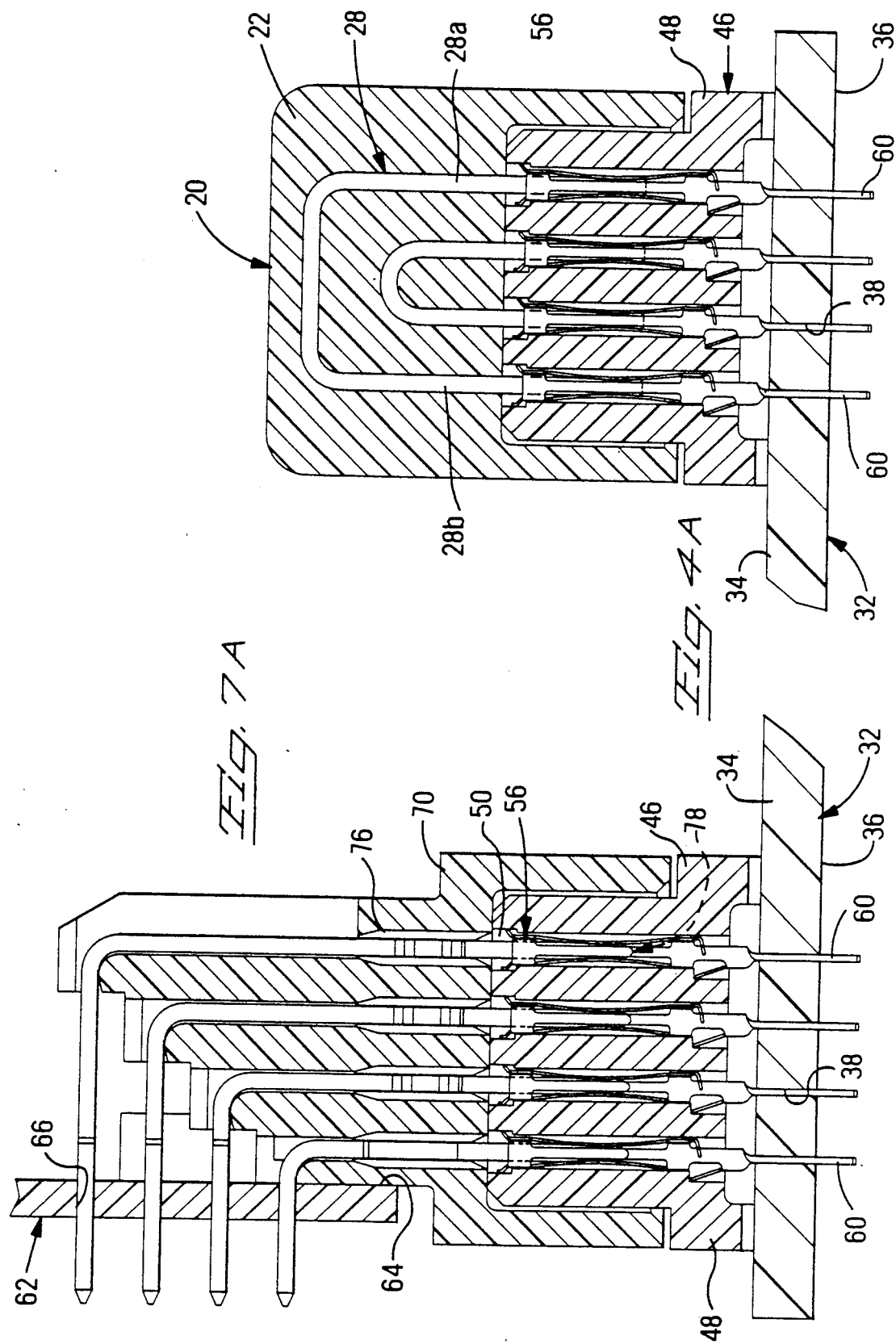

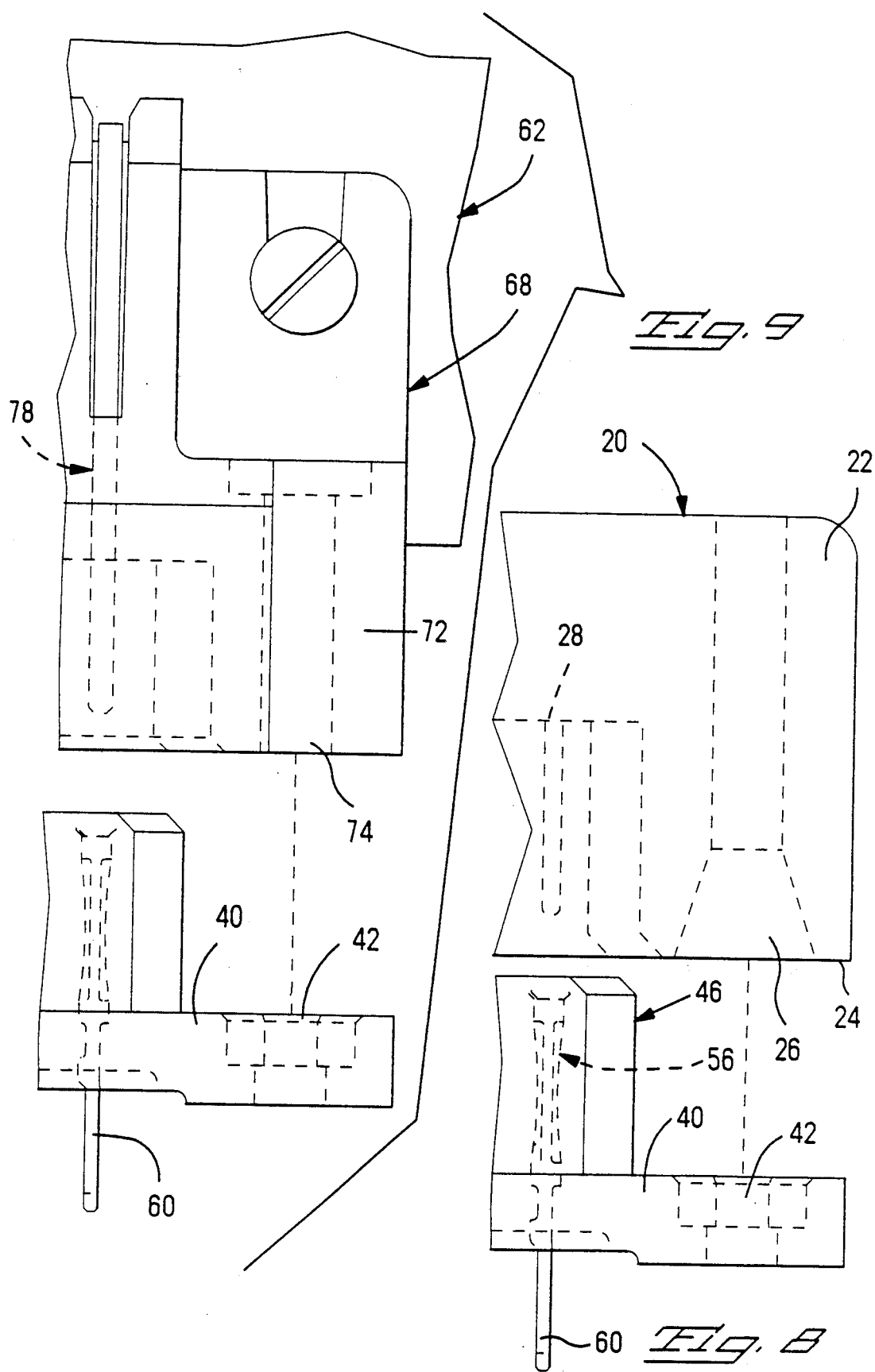

4,997,390

SHUNT CONNECTOR

FIELD OF THE INVENTION

The present invention is related to the field of electrical connectors, more particularly to connectors used on circuit panels.

BACKGROUND OF THE INVENTION

Interconnection systems are known which comprise a mother board electrically connected to an array of daughter boards. The daughter boards are electrically connected to the mother board by any of several types of known connectors and terminal members, and are interconnected by the mother board to each other. The mother board connectors include a dielectric housing member having a plurality of terminal members mounted therein. The terminal members include contact portions that pass through apertures in the board and extend outwardly from the undersurface of the board. The mother board contains a plurality of circuits electrically connected in series through the connectors via the daughter boards.

Typically the daughter boards provide different functions or programs for an electronic system that are then transmitted to the "outside world" through the mother board connectors. If a particular electronic application does not require the use of daughter boards engaged with all the mother board connectors, the open circuits in the "unused" mother board connector prevents a signal from being transmitted to subsequent connectors and their respective daughter boards. One method to "close" these open circuits is by "wire wrapping" the terminal member leads that protrude from the lower surface of the mother board to the appropriate terminal member leads in the next mother board connector thus allowing signals to be transmitted between the adjacent connectors. This wire wrapping takes time and in many instances requires that the mother board and the associated daughter boards be removed from the apparatus in order to accomplish the task. Furthermore, should a daughter board in one of the array become damaged or otherwise need to be removed from the system, the system is down until the daughter board has been repaired and/or replaced or wire wrapping has occurred.

It is desirable, therefore, to have a means whereby open circuits can be readily closed while minimizing down time of the system.

It is also desirable to have a system whereby a standardized mother board can be used in a series of applications, each of which may require a different number or arrangement of daughter boards.

It is further desirable to have a system whereby a daughter board may readily be added or changed at a later time without having to disturb the remaining system.

Additionally, it is desirable to have a means to change the capabilities of a system with a minimum amount of effort.

SUMMARY OF THE INVENTION

Accordingly, the present invention provides a means that alleviates the disadvantages and deficiencies of the prior art and furthermore provides a system for interconnecting and array of daughter cards to each other through a mother board that is readily adaptable for receiving, interconnecting and removing the daughter cards from the array. The present invention is a shunt connector comprising a dielectric housing member adapted to be mated with a mother board connector in place of the absent daughter board. The housing member includes a plurality of shunt terminal members secured therein, the shunt terminal members being selectively shaped and selectively positioned in the housing member to correspond to the open circuits desired to be closed in the mother board connector. Upon mating the shunt connector to a respective mother board connector, the open circuits are closed by the shunt terminal member thus allowing the desired signals to be transmitted between adjacent daughter boards and through the system.

It is an object of the invention, therefore, to have a means whereby open circuits in a mother board-daughter board interconnection system can be readily closed while minimizing down time of the system.

It is an object of the present invention is to provide a connector for insuring transmission of signals through a plurality of connectors electrically connected in series.

It is a further object of the invention to provide a means whereby open circuits in an array of connectors can be readily closed without the need for wire wrapping.

It is also an object of the invention to have a system whereby a standardized mother board can be used in a series of applications, each of which may require a different number or arrangement of daughter boards.

It is an additional object of the invention to provide a means whereby a daughter card can be removed from the system and the remaining system remain in a functioning condition without having to rewire the circuit board.

It is additionally an object of the invention to have a means to change the capabilities of a system with a minimum amount of effort.

The invention itself, together with further objects and its intended advantages, will be best understood by reference to the following detailed description taken in conjunction with the following drawings.

BRIEF DESCRIPTION OF THE DRAWINGS

FIG. 1 is a pictorial view of a mother board having a plurality of connectors thereon having an array of daughter boards and one shunt connector of the present invention electrically engaged with corresponding connectors and one shunt connector of the present invention exploded from a corresponding mother board connector.

FIG. 2 is a view taken in the direction indicated by the arrows in FIG. 1 showing both shunt connectors exploded from the corresponding mother board connectors.

FIG. 3 is a view taken in the direction indicated by the arrows in FIG. 1 showing both shunt connectors electrically engaged to corresponding mother board connector.

FIGS. 4 and 4A are cross-sectional views of a shunt connector of the present invention exploded from and mated with a corresponding mother board connector respectively.

FIG. 5 is a fragmentary perspective view of the portion of a shunt connector.

FIG. 6 is a top plan view of the mating face of a shunt connector.

FIGS. 7 and 7A are cross-sectional views of the a daughter board and its associated connector exploded FIG. 8 shows a method of securing a shunt connector to the mother board.

FIG. 9 shows a method of securing the daughter board connector to the mother board.

DETAILED DESCRIPTION OF THE DRAWINGS

Figure 10:
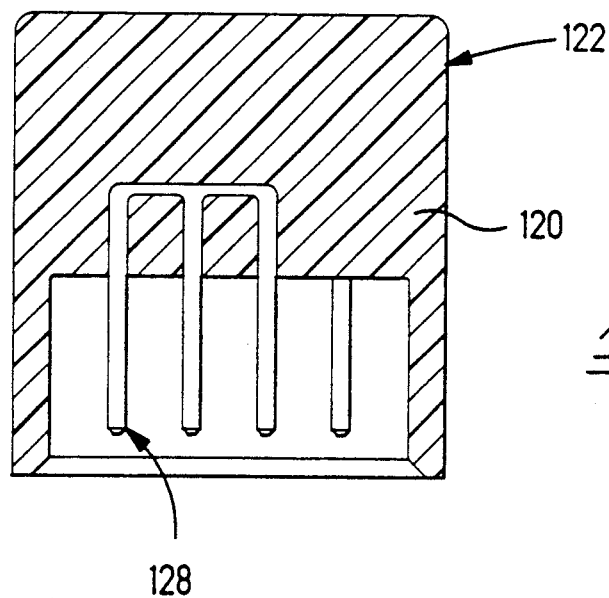
FIGS. 10 and 11 show alternative embodiments of the shunt terminal members made in accordance with the invention.

FIG. 1 shows a pictorial view of an electronic system 30 comprising a mother board 32 having a plurality of electrical connectors 46 mounted thereon, an array of daughter boards 62 electrically connected to respective ones of the connectors 46 and two shunt connectors 20 of the present invention. FIGS. 2 and 3 taken from the direction indicated by arrows in FIG. 1, show the two shunt connectors 20 of the present invention exploded from and electrically engaged with corresponding mother board connectors 46 respectively. For purposes of this application, the terms "unmated mother board connector" or "open circuit mother board connector" are to be understood to mean a mother board connector that is not interconnected to a daughter board.

Referring now to FIGS. 1-4A, 7 and 7A, mother board 32 has opposed first and second major surfaces 34, 36 and a plurality of apertures or through holes 38 extending therebetween. A card guide 40 having slots 42 therein for receiving edges of the daughter cards 62 extends upwardly from the rear edge of the mother board. Each mother board connector 46 comprises a housing member 48 having a plurality of terminal receiving passageways 50 extending therethrough and arranged in multiple rows and columns and a plurality of electrical terminal members 56 disposed in respective terminal receiving passageways 50. For the purposes of this application, connector 46 has four rows of terminal members and each column therefore includes four terminal members.

In the embodiment shown, the electrical terminal members 56 include respective socket portions 58 and pin or leg portions 60, which extend through the apertures 38 of mother board 32, as best seen in FIGS. 4 and 7, and preferably are soldered to the under surface 36 of the mother board 32. For purposes of illustrating the invention, solder has been omitted from the Figures at the various circuit board interconnections. Details of the mechanical means of securing the respective connectors to mother board connectors or to the mother board 32 also have been omitted from these Figures. It is to be understood that other terminal members may also be used in the mother board connectors.

The details of the structure of shunt connector 20 will be best understood by referring to FIGS. 4, 4A, 5 and 6. Shunt connector 20 comprises dielectric housing member 22 and a plurality of bridge or shunt terminal members 28 arranged in a preselected pattern and selectively positioned in housing member 22 to correspond to open circuits in respective columns that need to be commoned in the mother board connectors 46. One such arrangement of shunt terminal members is shown in FIG. 6 which illustrates an array of four rows and a plurality of columns indicating the selected locations for shunt terminal members 28 to maintain the continuity of the circuits within the circuit board. In the terminal member configuration shown in FIGS. 4 and 4A, one shunt terminal member 28a commons the outer most terminal members 56 and a second shunt terminal member 28b commons the inner most terminal members 56 of a column of a in corresponding mother board connector 46. It is to be understood that this is merely representative of the possible arrangements of shunting. The purpose of the shunt is to provide continuity between adjacent terminal members within the same column. If a system requires it, shunting can also be provided between terminal members of the same row. It is important, however, that the shunt terminal members be electrically isolated from each other.

The shunt connector 20 is made by first determining which circuits need to be closed between the corresponding terminal members in a row of mother board connector 46 and forming shunt terminal members 28 accordingly. In the preferred method of making connector 20, a dielectric housing member is molded around the preformed terminal members by insert molding techniques as known in the art. The material used for the dielectric housing member of the shunt connector 20 is selected in accordance with the properties required for the corresponding connectors 46 and 68 of the mother board 32 and daughter boards 62 respectively. The material should be one that is suitable for use in the environment in which the mother board and daughter board system 30 is to be used. The dielectric properties of the selected material will determine the thickness of the layer of dielectric material that is to separate adjacent shunt terminal members, such as 28a and 28b.

As can be seen in FIGS. 1, 2 and 3 two of mother board connectors 46 are mated with corresponding shunt connectors 20 and the remaining three mother board connectors 46 are electrically engaged with connectors 68 mounted along sides 64 of daughter boards 62. Connectors 68 mounted to of the daughter boards 62 comprise dielectric housing member 70 having a plurality of terminal receiving passageways 76 extending therethrough for receiving a plurality of terminal members 78 therein. Terminal members 78 are adapted to engageably mate with terminal members 56 in the mother board connector 46.

FIGS. 8 and 9 show representative means suitable for mounting and/or aligning respective shunt connector 20 and daughter board connector 68 to corresponding mother board connector 46. It should be appreciated that these means, as known in the art may include keying features, alignment pins and the like to insure the components are correctly mated. Mother board connector 46 includes flange 40 having aperture 42 extending therethrough for receiving mounting or aligning means therein. FIGS. 5 and 8 show a corresponding flange portion 24 of shunt connector 20 having aperture 26 extending therethrough. FIG. 8 shows shunt connector 20 exploded from connector 46 and the aligned mounting means apertures 26, 42 extending from upper surface of the shunt housing member 22, through the shunt connector 20 and engagable with the corresponding aperture 42 in mother board connector 46. FIG. 9 shows similar mounting means in daughter board connector 68 having flange 72 and aperture 74 extending therethrough for mechanically securing daughter board connector 68 to mother board connector 46.

Figure 11:
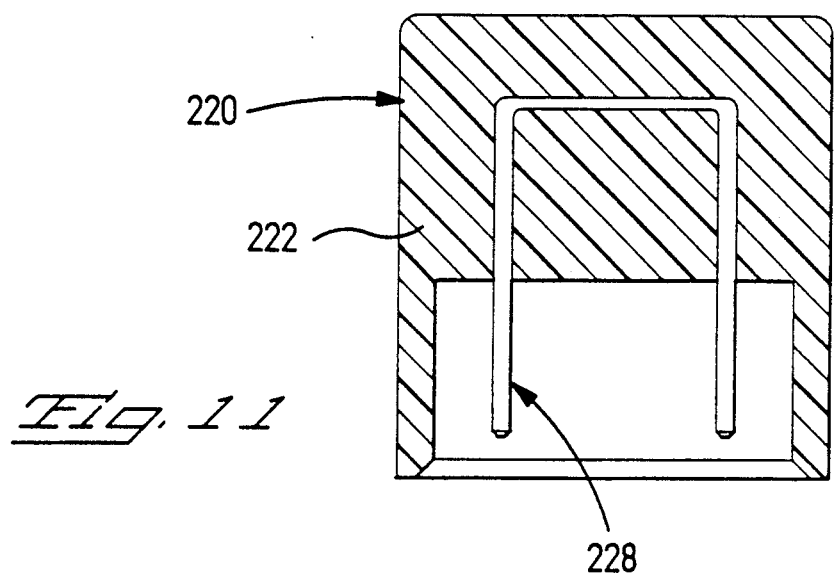

FIGS. 10 and 11 show alternative embodiments of shunt arrangements. In FIG. 10 three adjacent terminal members are shunted. In FIG. 11 only two terminal members are to be shunted. It is to be understood that various types of arrangements of pins made be made in accordance with the invention.

As can be seen from the figures, the shunt connector can readily replace and remove daughter board without the need for wire wrapping the terminal member ends extending through the bottom of the mother board. Upon removal of a daughter board, shunt connector can be plugged into place thus closing the open circuits and allowing the system to continue to function.

The present invention also provides a means whereby a standard mother board having a plurality of connectors can be made that will be suitable for use in equipment that requires less than the full amount of allowable daughter boards. The system also provides a means whereby further capability can be added to the mother board as additional pieces of equipment or functions are desirable to add to the system.

It is thought that the shunt connector of the present invention and many of its intended advantages will be understood from the foregoing description. Changes may be made in the form of construction and arrangement of parts thereof without departing from the spirit of the invention or sacrificing all of its material advantages.

We claim:

1. A shunt connector for use in a system including a mother board having a plurality of electrical interconnected with an array of daughter boards, each of said mother board connectors including a plurality of electrical terminal members selectively arranged in at least three rows and multiple columns and each of said daughter cards including an electrical connector along one edge thereof electrically matable with one of said mother board connectors; said shunt connector comprising:

a dielectric housing member having a mating face complimentary to said mother board connectors and adapted to be engaged thereby; and a plurality of shunt terminal members secured in said housing member, said shunt terminal members being selectively shaped and selectively positioned in said housing member to correspond to open circuits desired to be closed in at least one mother board connector upon removal of a daughter board connector therefrom, said shunt terminal members including at least one member interconnecting adjacent mother board terminal members and at least one shunt terminal member interconnecting nonadjacent mother board terminal members;

whereby the system remains operable in the absence of a daughter card at least one selected location upon mating a said shunt connector to each mother board connector at said at least one selected location, said open circuits are closed by said shunt terminal members, thus allowing signals to be transmitted between the remaining daughter boards and through the system without requiring rewiring of the circuit board.

2. The shunt connector of claim 1 wherein said terminal members in said mother board connectors are socket terminal members and said shunt terminal members include pin terminal portions receivable in said socket terminal members.

3. The shunt connector of claim 1 wherein said shunt terminal members common open circuits between a terminal member in one column with at least one other one of said terminal members in said column.

4. The shunt connector of claim 1 wherein said shunt housing member is molded over said shunt terminal members.

5. The shunt connector of claim 1 further including at least one shunt terminal member interconnecting three mother board terminal members in a selected column.

6. The shunt connector of claim 1 wherein said electrical terminal members in said mother board connectors are arranged in at least four rows and multiple columns.

7. The shunt connector of claim 6 wherein said shunt terminal members include at least a first shunt terminal member for interconnecting two adjacent mother board terminal members in inner rows of said terminal members of a column and at least a second shunt terminal member for interconnecting two mother board terminal members along outer rows of the same column, each said first and second terminal members including first and second connecting portions extending in a common plane from an intermediate body portion and each associated first and second shunt terminal members lie essentially in the same plane with the body of the second shunt terminal member spaced from and lying above the body portion of the associated first shunt terminal member.

8. A shunt connector for use in a system including a mother board having a plurality of electrical connectors connected in series thereon for electrical interconnection with an array of daughter boards, each of said mother board connectors including a plurality of electrical terminal members selectively arranged in at least three rows and multiple columns and each of said daughter cards including an electrical connector along one edge thereof matable with one of said mother board connectors the number of mother board connectors in said plurality being at least one greater than the number of daughter cards in said array such that said at least one mother board connector is not electrically connected to a daughter board; said shunt connector comprising:

a dielectric housing member having a mating face complimentary to said mother board connectors and adapted to be engaged thereby; and a plurality of shunt terminal members secured in said housing member, said shunt terminal members being selectively shaped and selectively positioned in said housing member to correspond to open circuits desired to be closed in said at least one mother board connector, said shunt terminal members including at least one member interconnecting adjacent mother board terminal members and at least one shunt terminal member interconnecting nonadjacent mother board terminal members;

whereby the system remains operable in the absence of a daughter card with at least one mother board connector upon mating a said shunt connector to a respective at least one unmated mother board connector, said open circuits are closed by said shunt terminal members, thus allowing signals to be transmitted between the remaining daughter boards and through the system.

9. The shunt connector of claim 8 wherein said terminal members in said mother board connectors are socket terminal members and said shunt terminal members include pin terminal portions receivable in said socket terminal members.

10. The shunt connector of claim 8 wherein said shunt terminal members common open circuits between a terminal member in one column with at least one other one of said terminal members in said column.

11. The shunt connector of claim 8 wherein said shunt housing member is molded over said shunt terminal members.

12. The shunt connector of claim 8 further including at least one shunt terminal member interconnecting three mother board terminal members in a selected column.

13. The shunt connector of claim 8 wherein said electrical terminal members in said mother board connectors are arranged in at least four rows and multiple columns.

14. The shunt connector of claim 13 wherein said shunt terminal members include at least a first shunt terminal member for interconnecting two adjacent mother board terminal member in inner rows of said terminal members of a column and at least a second shunt terminal member for interconnecting two mother board terminal members along outer rows of the same column, each said first and second terminal members including first and second connecting portions extending in a common plane from an intermediate body portion and each associated first and second shunt terminal members lie essentially in the same plane with the body of the second shunt terminal member spaced from and lying above the body portion of the associated first shunt terminal member.

15. A method for closing open circuits a mother board connector in a system including a mother board having a plurality of electrical connectors connected in series thereon for electrical interconnection with an array of daughter boards, each of said mother board connectors including a plurality of electrical terminal members selectively arranged in at least three rows and multiple columns and each of said daughter cards including an electrical connector along one edge thereof electrically matable with one of said mother board connectors, the number of mother board connectors in said plurality being at least one greater than the number of daughter cards in said array such that said at least one mother board connector is not electrically connector to a daughter board; the method comprising the steps of:

selecting a desired shape for a plurality of shunt terminal members, the shape corresponding to distance between selected terminal members to be shunted in said unmated mother board connector, said shape including at least one member for interconnecting adjacent mother board terminal members and at least one shunt terminal member for interconnecting nonadjacent mother board terminal members;

selectively positioned said plurality of shunt terminal members in a desired arrangement to correspond to open circuits desired to be closed in said at least one mother board connector;

molding a dielectric housing member around said selectively positioned shunt terminal members, said housing member having a mating face complimentary to said at least one unmated mother board connector and adapted to be engaged thereby; and mating said shunt connector to said at least one unmated mother board connector;

whereby said open circuits in said at least one mother board connector are closed by said shunt terminal members, thus allowing signals to be transmitted between the daughter boards and through the system.

16. A system comprising:

a mother board having at least three daughter card locations with mother board connectors thereat, each said mother board connector having at least three rows and multiple columns of signal terminals therein;

continuous electrical signal paths associated with signal terminal locations open at each daughter card location, each signal path being in series and requiring each terminal in series to be closed for operability;

at least two nonadjacent mother board connectors having daughter cards mated thereto; and a shunt connector at the location intermediate the two nonadjacent locations, said shunt connector including a dielectric housing member having a mating face complimentary to said mother board connectors and adapted to be engaged thereby and a plurality of shunt terminal members secured in said housing member, said shunt terminal members being selectively shaped and selectively positioned in said housing member to correspond to open circuits desired to be closed at said intermediate location, whereby said shunt connector closes respective open circuits enabling completion of the signal paths for operability of said system absent a daughter card at said location.

17. The system of claim 16 wherein said shunt terminal members include at least one member interconnecting adjacent mother board terminal members and at least one shunt terminal member interconnecting nonadjacent mother board terminal members.

18. The system of claim 16 wherein said shunt connector further includes at least one shunt terminal member interconnecting three mother board terminal members in a selected column.

19. The system of claim 16 wherein said electrical terminal members in said mother board connectors are arranged in at least four rows and multiple columns.

20. The system of claim 19 wherein said shunt terminal members include at least a first shunt terminal member for interconnecting two adjacent mother board terminal members in inner rows of said terminal members of a column and at least a second shunt terminal member for interconnecting two mother board terminal members along outer rows of the same column, each said first and second terminal members including first and second connecting portions extending in a common plane from an intermediate body portion and each associated first and second shunt terminal members lie essentially in the same plane with the body of the second shunt terminal member spaced from and lying above the body portion of the associated first shunt terminal member.

* * * * *

UNITED STATES PATENT OFFICE
CERTIFICATE OF CORRECTION

Patent No. 4,997,390      Dated March 5, 1991

Inventor(s) James P. Scholz et al.

It is certified that error appears in the above-identified patent and that said Letters Patent is hereby corrected as shown below:

In the Claims:

Claim 1, Column 5, Line 27 - After the word "electrical" insert --connectors connected in series thereon and electrically--.

Claim 14, Column 7, Line 17 - the word "member" should be --members--.

Signed and Sealed this

Fifteenth Day of September, 1992

*Attest:*

DOUGLAS B. COMER

*Attesting Officer*      *Acting Commissioner of Patents and Trademarks*